(12) United States Patent
Choi et al.

(10) Patent No.: US 11,191,151 B2
(45) Date of Patent: Nov. 30, 2021

(54) SEMICONDUCTOR MODULE INCLUDING A PRINTED CIRCUIT BOARD

(71) Applicant: SK hynix Inc., Icheon (KR)

(72) Inventors: Kyu Yong Choi, Icheon (KR); Jin Ho Bae, Anyang (KR); Yu Jeong Choe, Seoul (KR)

(73) Assignee: SK hynix Inc., Icheon (KR)

( * ) Notice: Subject to any disclaimer, the term of this patent is extended or adjusted under 35 U.S.C. 154(b) by 147 days.

(21) Appl. No.: 16/562,082

(22) Filed: Sep. 5, 2019

(65) Prior Publication Data
US 2020/0296822 A1 Sep. 17, 2020

(30) Foreign Application Priority Data
Mar. 12, 2019 (KR) .................. 10-2019-0027986

(51) Int. Cl.
*H05K 1/02* (2006.01)
*H05K 1/11* (2006.01)
*H05K 1/18* (2006.01)

(52) U.S. Cl.
CPC .......... *H05K 1/0228* (2013.01); *H05K 1/115* (2013.01); *H05K 1/117* (2013.01); *H05K 1/181* (2013.01); *H05K 2201/09409* (2013.01); *H05K 2201/09672* (2013.01); *H05K 2201/10159* (2013.01)

(58) Field of Classification Search
CPC ............... H05K 1/0228; H05K 1/117; H05K 2201/09409; H05K 2201/09672; H05K 2201/10159
USPC ........................................................ 361/767
See application file for complete search history.

(56) References Cited

U.S. PATENT DOCUMENTS

| | | | |
|---|---|---|---|
| 6,008,534 A * | 12/1999 | Fulcher | H01L 23/66 |
| | | | 257/691 |
| 10,091,873 B1 | 10/2018 | Xiong | |
| 2006/0192282 A1* | 8/2006 | Suwa | H01L 23/5385 |
| | | | 257/723 |
| 2007/0205498 A1* | 9/2007 | Djordjevic | H01P 3/085 |
| | | | 257/698 |
| 2007/0218741 A1* | 9/2007 | Langgood | H01R 13/62988 |
| | | | 439/328 |
| 2015/0223321 A1* | 8/2015 | Ling | H05K 3/30 |
| | | | 174/36 |
| 2016/0062819 A1* | 3/2016 | Oh | G11C 29/4401 |
| | | | 714/6.11 |
| 2017/0032832 A1* | 2/2017 | Suwa | H01L 23/49816 |
| 2017/0097790 A1* | 4/2017 | Doo | G06F 3/0635 |

FOREIGN PATENT DOCUMENTS

KR 20090114628 A 11/2009

* cited by examiner

*Primary Examiner* — Sherman Ng (57) ABSTRACT

A device may include a substrate having a first surface and a second surface, a first conductive terminal disposed over the first surface, a second conductive terminal spaced apart from the first conductive terminal in a first direction and disposed over the first surface, a first conductive auxiliary pattern disposed below the first conductive terminal and overlapping with the first conductive terminal, the first conductive auxiliary pattern being coupled to the second conductive terminal, and a second conductive auxiliary pattern disposed below the second conductive terminal and overlapping with the second conducive terminal, the second conductive auxiliary pattern being coupled to the first conductive terminal.

18 Claims, 5 Drawing Sheets

SEMICONDUCTOR MODULE INCLUDING A PRINTED CIRCUIT BOARD

CROSS-REFERENCE TO RELATED APPLICATION

The present application claims priority under 35 U.S.C. § 119(a) to Korean application number 10-2019-0027986, filed on Mar. 12, 2019, in the Korean Intellectual Property Office, which is incorporated herein by reference in its entirety.

BACKGROUND

1. Technical Field

Various embodiments may generally relate to a semiconductor integrated circuit system, more particularly, to a semiconductor module including a printed circuit board (PCB) that may reduce crosstalk.

2. Related Art

In order to provide a memory device with a high speed and a large capacity, the number and types of control signals may be increased. Further, in order to reduce noises caused by the high speed, the number of power pins may also be increased. Furthermore, the number of terminals on a PCB and a semiconductor module, for example, a dual in-line memory module (DIMM) including the PCB may also be increased.

However, as the number of conductive terminals or pins in a given area is increased, crosstalk between the conductive terminals or pins may occur. The crosstalk may result in generating system errors such as a logic fail caused by a time delay.

SUMMARY

In example embodiments of the present disclosure, a device may include a substrate having a first surface and a second surface, a first conductive terminal disposed over the first surface, a second conductive terminal spaced apart from the first conductive terminal in a first direction and disposed over the first surface, a first conductive auxiliary pattern disposed below the first conductive terminal and overlapping with the first conductive terminal, the first conductive auxiliary pattern being coupled to the second conductive terminal, and a second conductive auxiliary pattern disposed below the second conductive terminal and overlapping with the second conducive terminal, the second conductive auxiliary pattern being coupled to the first conductive terminal.

In example embodiments of the present disclosure, a semiconductor module may include a printed circuit board (PCB), a plurality of semiconductor chips, first and second conductive terminals and first and second conductive auxiliary patterns. The PCB may have a first surface and a second surface. The semiconductor chips may be disposed on the first surface of the PCB. The first and second conductive terminals is configured to communicate with the plurality of semiconductor chips. The first and second conductive terminals are disposed over the first surface of the PCB and spaced apart from each other in a first direction. The first and second conductive auxiliary patterns are disposed in the PCB. The first and second conductive auxiliary patterns are provided below the first and second conductive terminals to overlap with the first and second conductive terminals, respectively. The first conductive auxiliary pattern is coupled to the second conductive terminal, and the second conductive auxiliary pattern is coupled to the first conductive terminal.

In example embodiments of the present disclosure, an electronic device may include a memory module configured to store data, a controller configured to control an operation of the memory module, and a processor configured to process data received from the controller. The memory module includes a printed circuit board (PCB) having a first surface and a second surface, a plurality of semiconductor chips disposed over the first surface of the PCB, first and second conductive terminals configured to communicate with the plurality of semiconductor chips, the first and second conductive terminals being disposed over the first surface of the PCB, and first and second conductive auxiliary patterns disposed in the PCB, the first and second conductive auxiliary patterns provided below the first and second conductive terminals and overlapping with the first and second conductive terminals, respectively. The first conductive auxiliary pattern is coupled to the second conductive terminal, and the second conductive auxiliary pattern is coupled to the first conductive terminal.

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Various embodiments of the present disclosure will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the invention as defined in the appended claims.

The invention of the present disclosure is described herein with reference to cross-section and/or plan illustrations of idealized embodiments of the present invention. However, embodiments of the present disclosure should not be construed as limiting the inventive concept. Although a few embodiments of the present disclosure will be shown and described, it will be appreciated by those of ordinary skill in the art that changes may be made in these embodiments without departing from the principles and spirit of the invention of the present disclosure.

Figure 1:
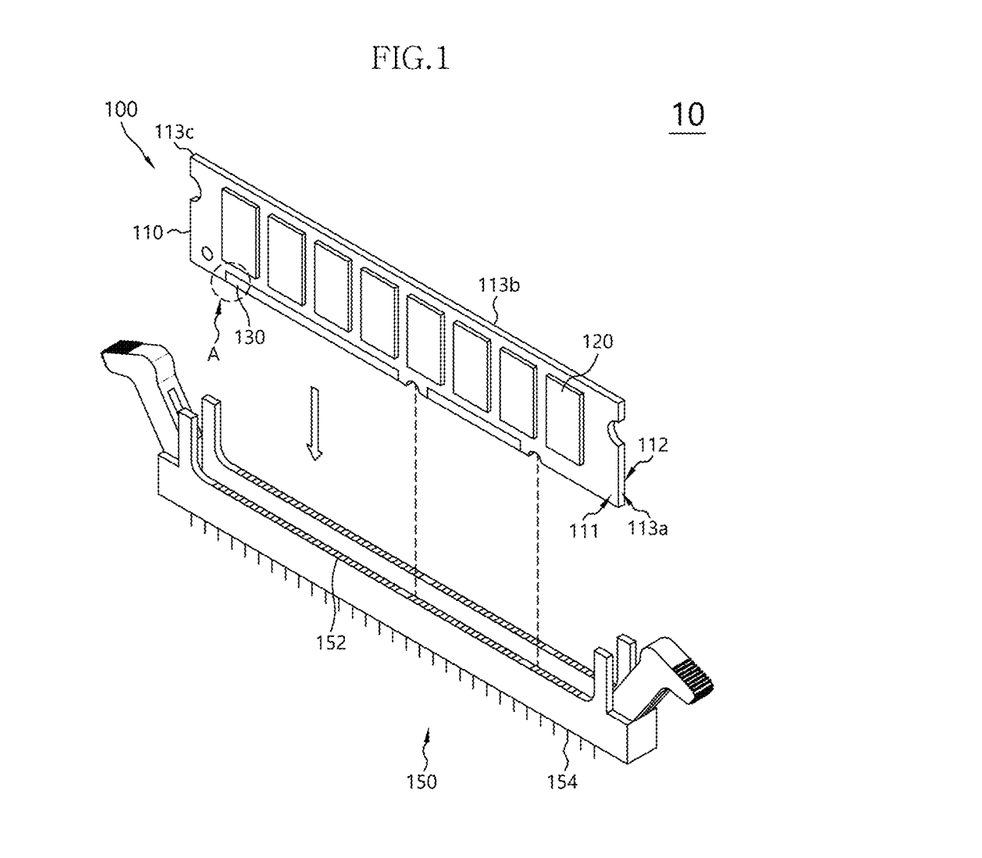
FIG. 1 is a perspective view illustrating a semiconductor integrated circuit system in accordance with an embodiment.

FIG. 1 is a perspective view illustrating a semiconductor integrated circuit system 10 in accordance with an embodiment.

Referring to FIG. 1, the semiconductor integrated circuit system 10 may include a memory module (e.g., a DIMM) 100 and a module connector (e.g., a DIMM connector) 150.

The DIMM 100 may include a printed circuit board (PCB) 110, a plurality of semiconductor chips 120, and a plurality of conductive terminals 130.

The PCB 110 may have a front surface 111, a rear surface 112, and a plurality of side surfaces 113a to 113c. The semiconductor chips 120 may be mounted on the front surface 111 of the PCB 110. In an embodiment, one or more of the semiconductor chips 120 include a dynamic random access memory (DRAM). However, embodiments of the present disclosure are not limited thereto. For example, in other embodiments, one of more of the semiconductor chips 120 include a non-volatile memory such as a Phase Change Random Access Memory (PRAM), a Magnetic RAM (MRAM), a Resistive RAM (RRAM), or a Ferroelectric RAM (FRAM).

The conductive terminals 130 may be arranged on edge portions of the front surface 111 and the rear surface 112 of the DIMM 100, such that adjacent conductive terminals 130 are spaced apart from each other by a given distance to respectively correspond to adjacent internal terminals 152 of the DIMM connector 150. For example, the conductive terminals 130 may be formed using a tape automated bonding (TAB) process.

The DIMM connector 150 may be a coupler for detachably coupling the DIMM 100 to a main printed circuit board (not shown) such as a motherboard. The DIMM connector 150 may include the internal terminals 152 configured to couple the DIMM 100 and external terminals 154. The external terminals 154 are coupled with the main printed circuit board.

Figure 2:
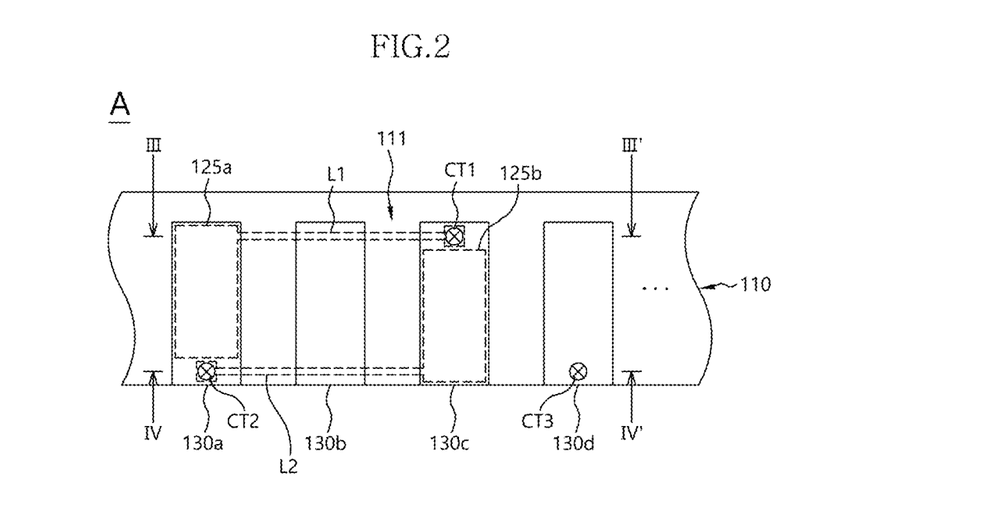
FIG. 2 is an enlarged plan view illustrating a portion "A" of a DIMM in FIG. 1 in accordance with an embodiment.

FIG. 2 is an enlarged plan view illustrating a portion "A" of the DIMM 100 in FIG. 1.

Referring to FIG. 2, a plurality of upper conductive terminals 130a to 130d may be arranged on an edge portion of the front surface 111 of the PCB 110 by a uniform interval. For example, any pair of adjacent upper conductive terminals 130a to 130d are spaced apart from each other by the same distance. In an embodiment, the first upper conductive terminal 130a may correspond to a first input/output signal terminal, the third upper conductive terminal 130c may correspond to a second input/output signal terminal, and each of the second and fourth upper conductive terminals 130b and 130d may correspond to a ground terminal. Hereinafter, the first upper conductive terminal 130a may be referred to as the first input/output signal terminal, and the third upper conductive terminal 130c may be referred to as the second input/output signal terminal. In the embodiment shown in FIG. 2, the ground terminal 130b may be disposed between the first and second input/output signal terminals 130a and 130c. In another embodiment, the first and second input/output terminals (not shown) may be sequentially arranged and disposed adjacent to each other. In still another embodiment, a terminal 130b configured for receiving other signals, rather than functioning as the ground terminal, may be arranged between the first and second input/output signal terminals 130a and 130c. A signal input into the first input/output signal terminal 130a may be different from a signal input into the second input/output signal terminal 130c.

In example embodiments, in order to reduce crosstalk between the upper conductive terminals 130a and 130c, auxiliary patterns 125a and 125b may be disposed in the PCB 110 to form a mutual capacitor (or mutual conductance) between each of the auxiliary patterns 125a and 126b and each of the upper conductive terminals 130a and 130c. For example, the first auxiliary pattern 125a and the first input/output signal terminal 130a forms a first mutual capacitor, and the second auxiliary pattern 125b and the second input/output signal terminal 130c form a second mutual capacitor, thereby reducing crosstalk between the first input/output signal terminal 130a and the second input/output signal terminal 130c.

The first auxiliary pattern 125a may be arranged to face and at least partially overlap with the first input/output signal terminal 130a. An insulating layer may be interposed between the first auxiliary pattern 125a and the first input/output signal terminal 130a. In an embodiment, the first auxiliary pattern 125a may entirely overlap with the first input/output signal terminal 130a. For example, the first auxiliary pattern 125a may be disposed entirely within the first input/output signal terminal 130a when seen in the plan view of FIG. 2. The first auxiliary pattern 125a may be electrically connected with the second input/output signal terminal 130c through a first contact CT1 and a first connection L1.

The second auxiliary pattern 125b may be arranged to face and at least partially overlap with the second input/output signal terminal 130c. An insulating layer may be interposed between the second auxiliary pattern 125b and the second input/output signal terminal 130c. In an embodiment, the second auxiliary pattern 125b may entirely overlap with the second input/output signal terminal 130c. For example, the second auxiliary pattern 125b may be disposed entirely within the second input/output signal terminal 130c when seen in the plan view of FIG. 2. The second auxiliary pattern 125b may be electrically connected with the first input/output signal terminal 130a through a second contact CT2 and a second connection L2.

Therefore, the first auxiliary pattern 125a may receive a signal (e.g., a voltage) input into the second input/output signal terminal 130c. The second auxiliary pattern 125b may receive a signal (e.g., a voltage) input into the first input/output signal terminal 130a.

In FIG. 2, a reference numeral CT3 may refer to a through via formed through the PCB 110.

Figure 3:
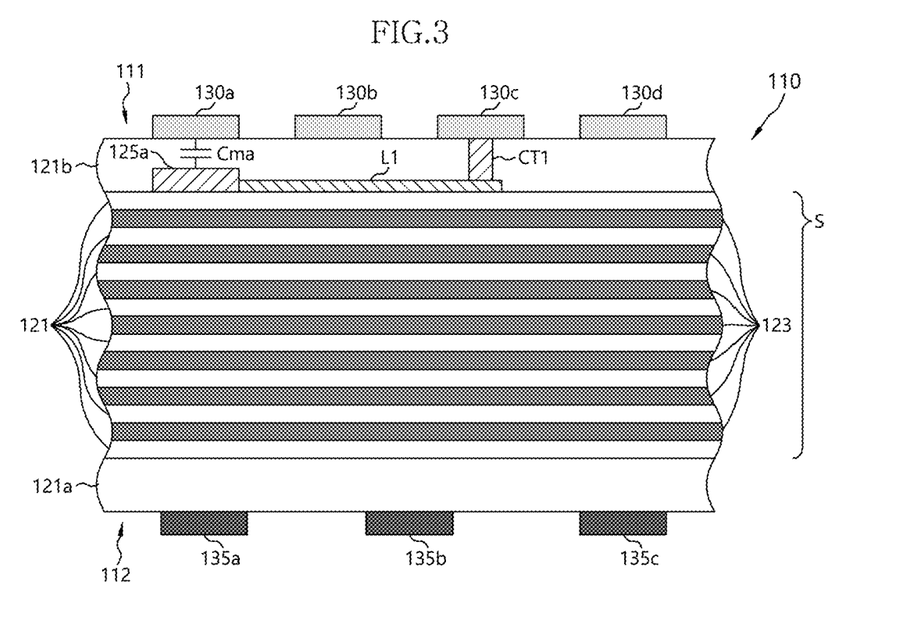
FIG. 3 is a cross-sectional view taken along a line III-III' in FIG. 2 in accordance with an embodiment.
Figure 4:
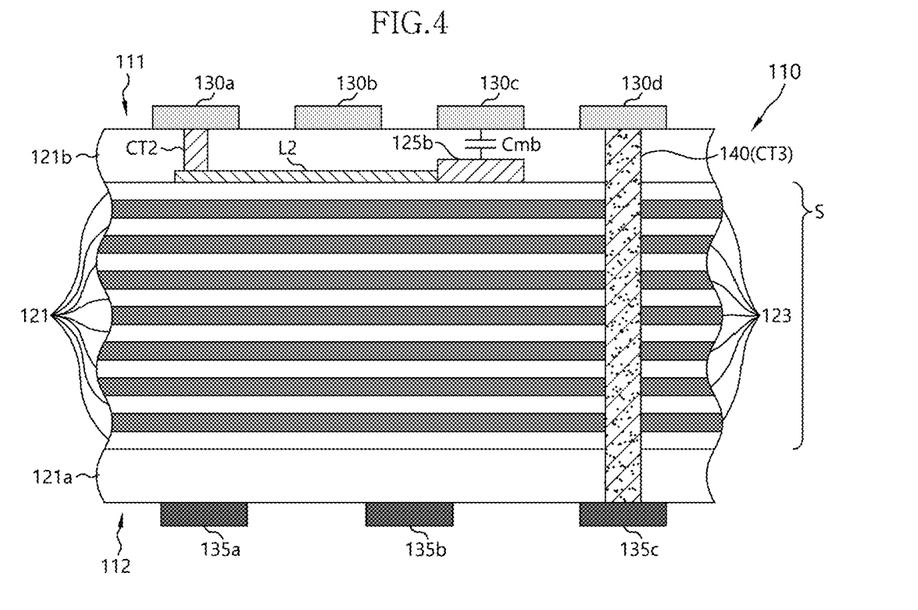
FIG. 4 is a cross-sectional view taken along a line IV-IV' in FIG. 2.

FIG. 3 is a cross-sectional view taken along a line III-III' in FIG. 2, and FIG. 4 is a cross-sectional view taken along a line IV-IV' in FIG. 2.

Referring to FIGS. 3 and 4, a plurality of build-up layers 121 and a plurality of conductive layers 123 may be alternately stacked over a lower insulating layer 121a to form a stack structure S. The build-up layers 121 may each include an insulating layer that is disposed between adjacent conductive layers 123 to electrically insulate the adjacent conductive layers 123 from each other.

The first auxiliary pattern 125a, the second auxiliary pattern 125b, the first connection L1, and the second connection L2 may be formed on the stack structure S, for example, an uppermost build-up layer 121 among the build-up layers 121. The first and second auxiliary patterns 125a and 125b may be located to face the first and second input/output signal terminals 130a and 130c, respectively The first connection L1 may extend from an edge portion of the first auxiliary pattern 125a to a region adjacent to the second auxiliary pattern 125b. For example, the first connection L1 may extend from a side edge portion of the first auxiliary pattern 125a to a region proximate to a top edge portion of the second auxiliary pattern 125b. The first connection L1 may be electrically insulated from the second auxiliary pattern 125b.

The second connection L2 may extend from an edge portion of the second auxiliary pattern 125b to a region adjacent to the first auxiliary pattern 125a. For example, the second connection L2 may extend from a side edge portion of the second auxiliary pattern 125b to a region proximate to a bottom edge portion of the first auxiliary pattern 125a. The second connection L2 may be electrically insulated from the first auxiliary pattern 125a.

In an embodiment, the first auxiliary pattern 125a, the second auxiliary pattern 125b, the first connection L1, and the second connection L2 may be formed by depositing a conductive layer on the uppermost build-up layer 121, and then by patterning the conductive layer. However, embodiments of the present disclosure are not limited thereto.

An upper insulating layer 121b may be formed on the stack structure S, the first auxiliary pattern 125a, the second auxiliary pattern 125b, the first connection L1, and the second connection L2.

The upper insulating layer 121b may be etched to form contact holes in the upper insulating layer 121b configured to expose end portions of the first and second connections L1 and L2. For example, the contact holes may be formed by a laser drilling, an etching process, etc. Subsequently, the contact holes may be filled with a conductive layer to form the first contact CT1 connected to the first connection L1, and the second contact CT2 connected to the second connection L2.

The upper conductive terminals 130a to 130d may be formed on the upper insulating layer 121b. The upper conductive terminals 130a to 130d may include copper. The upper conductive terminals 130a to 130d may be formed using the TAB process. The upper conductive terminals 130a to 130d may have substantially the same size and any pair of adjacent upper conductive terminals 130a to 130d are spaced apart from each other by the same distance. In an embodiment, the build-up layers 121, the lower insulating layer 121a, and the upper insulating layer 121b may include the same insulating material.

A plurality of lower conductive terminals 135a to 135c may be formed on a bottom surface of the lower insulating layer 121a. The lower conductive terminals 135a to 135c may be electrically connected to the internal terminals 152 of the DIMM connector 150 in FIG. 1 to receive various signals including input/output signals from an external device.

Although not explicitly shown in FIGS. 3 and 4, one or more of the upper conductive terminals 130a to 130d and one or more of the lower conductive terminals 135a to 135c may be electrically connected with one or more of the conductive layers 123 in the PCB 110 through contacts (not shown). In addition, one or more of the upper conductive terminals (e.g., the fourth upper conducive terminal 130d) may be connected to one or more of the lower conductive terminals (e.g., the third lower conductive terminal 135c) through respective vias (e.g., a via 140) formed through the PCB 110.

The first input/output signal terminal 130a and the second input/output signal terminal 130c may overlap with the first auxiliary pattern 125a and the second auxiliary pattern 125b, respectively, to form mutual capacitors Cma and Cmb, respectively. The first auxiliary pattern 125a may receive one input/output signal (e.g., the second input/output signal S2 in FIGS. 5 and 6) and the second auxiliary pattern 125b may receive the other second input/output signal (e.g., the first input/output signal S1 in FIGS. 5 and 6). Because the first input/output signal terminal 130a receives the first input/output signal S1 and the second input/output signal terminal 130c receives the second input/output signal S2, when the first input/output signal S1, or the second input/output signal S2, or both are received, the mutual capacitors Cma and Cmb may be continuously formed.

Not only the first contact CT1 and the second contact CT2 but also the first auxiliary pattern 125a and the second auxiliary pattern 125b may be arranged in a stagger shape. For example, when seen in the plan view of FIG. 2, the first auxiliary pattern 125a and the second contact CT2 are disposed within an area of the first input/output signal terminal 130a, and the second auxiliary pattern 125b and the first contact CT1 are disposed within an area of the second input/output signal terminal 130c. In addition, the first auxiliary pattern 125a and the second auxiliary pattern 125b are offset from each other in a vertical direction with respect to the orientation of FIG. 2, and the first contact CT1 and the second contact CT2 are offset from each other in the vertical direction. For example, the first contact CT1 and the second contact CT2 are arranged to be diagonally symmetric.

Crosstalk occurred between the first and second input/output signal terminals 130a and 130c adjacent to the mutual capacitors Cma and Cmb may be effectively reduced. Hereinafter, the underlying principle for reducing the crosstalk may be described in detail.

Figure 5:
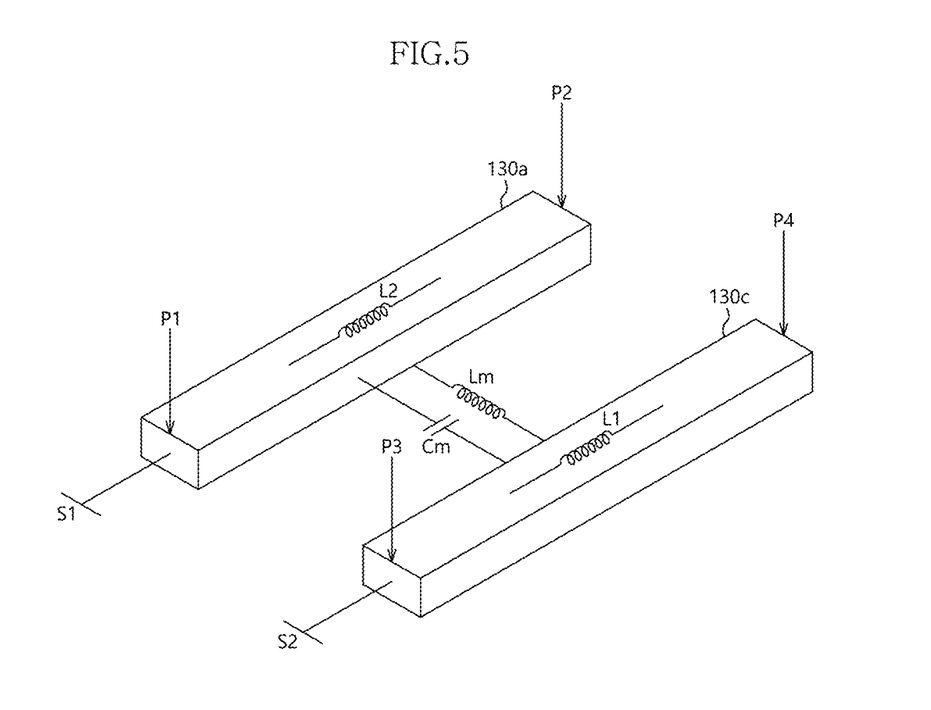
FIG. 5 illustrates generation of crosstalk in accordance with an embodiment.
Figure 6:
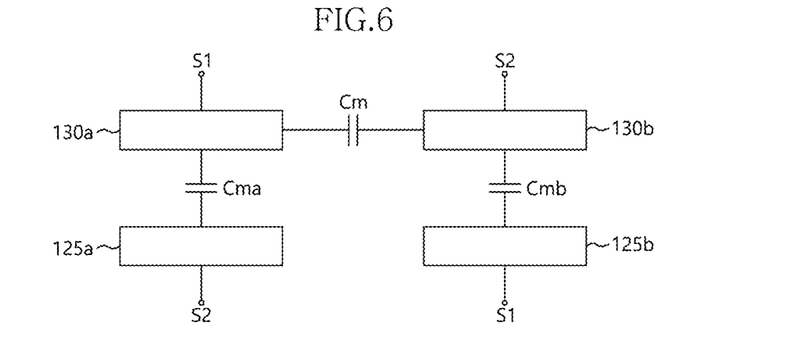
FIG. 6 illustrates a principle for reducing an effective mutual capacitance in accordance with an embodiment.

FIG. 5 illustrates generation of crosstalk in accordance with an embodiment. FIG. 6 illustrates an underlying principle for increasing effective mutual capacitance in accordance with an embodiment.

Generally, in a semiconductor system including a DIMM, data may be simultaneously transferred through a plurality of bus lines. Thus, crosstalk may occur between a plurality of input/output (I/O) signal lines.

Referring to FIG. 5, the crosstalk, for example, may be indicated by near end crosstalk (NEXT) and far end crosstalk (FEXT).

The NEXT may be indicate crosstalk between a first portion P1 of the first I/O signal terminal 130a and a third portion P3 of the second I/O signal terminal 130c that receive a first I/O signal S1 and a second I/O signal S2, respectively. The first portion P1 and the third portion P3 are adjacent to each other. The FEXT may indicate crosstalk between the first portion P1 of the first I/O signal terminal 130a and a fourth portion P4 of the second I/O signal terminal 130c. The NEXT and the FEXT may be represented by following Formula 1.

$$NEXT \propto (Cm/Ce + Lm/L)$$

$$FEXT \propto (Cm/Ce - Lm/L) \qquad \text{Formula 1}$$

In Formula 1, Cm may denote a mutual capacitance between the first I/O signal terminal 130a and the second I/O signal terminal 130c, Ce may denote an effective mutual capacitance between the first and second I/O signal terminals 130a and 130c, Lm may denote a mutual inductance between the first and second I/O signal terminals 130a and 130c, and L may denote an effective inductance between the first and second I/O signal terminals 130a and 130c. For the purpose of convenience of explanation, the same reference numeral (e.g., Cm) may refer to a capacitance (e.g., the mutual capacitance) and a capacitor (e.g., the mutual capacitor), and the same reference numeral (e.g., Lm) may refer to an inductance (e.g., the mutual inductance) and an inductor (e.g., the mutual inductor). Further, in the embodiments, the effective mutual capacitance Ce may be a total capacitance of the first I/O signal terminal 130a and the second I/O signal terminal 130c.

When effects of the mutual inductance Lm and the effective inductance L may be negligible compared to those of the mutual capacitance Cm and the effective mutual capacitance Ce, the NEXT and the FEXT may be dominantly determined by the effective mutual capacitance Ce.

In order to increase the effective mutual capacitance Ce, the first and second auxiliary patterns 125a and 125b may be arranged under the first and second I/O signal terminals 130a and 130c, respectively. For example, the first auxiliary pattern 125a may be arranged to overlap with the first I/O signal terminal 130a, and the second auxiliary pattern 125b may be arranged to overlap with the second I/O signal terminal 130c.

Referring to FIG. 6, the second I/O signal S2 may be applied to the second I/O signal terminal 130c and the first auxiliary pattern 125a, and the first I/O signal S1 may be applied to the first I/O signal terminal 130a and the second auxiliary pattern 125b. As a result, the first mutual capacitor Cma may be formed between the first I/O signal terminal 130a and the first auxiliary pattern 125a and the second mutual capacitor Cmb may be formed between the second I/O signal terminal 130c and the second auxiliary pattern 125b.

Referring to FIG. 6, the first mutual capacitor Cma, the mutual capacitor Cm, and the second mutual capacitor Cmb may be connected in parallel between the terminals for receiving the first and second I/O signals S1 and S2. Thus, the effective mutual capacitance Ce between the first I/O signal terminal 130a and the second I/O signal terminal 130c may be increased to decrease the FEXT.

Figure 7:
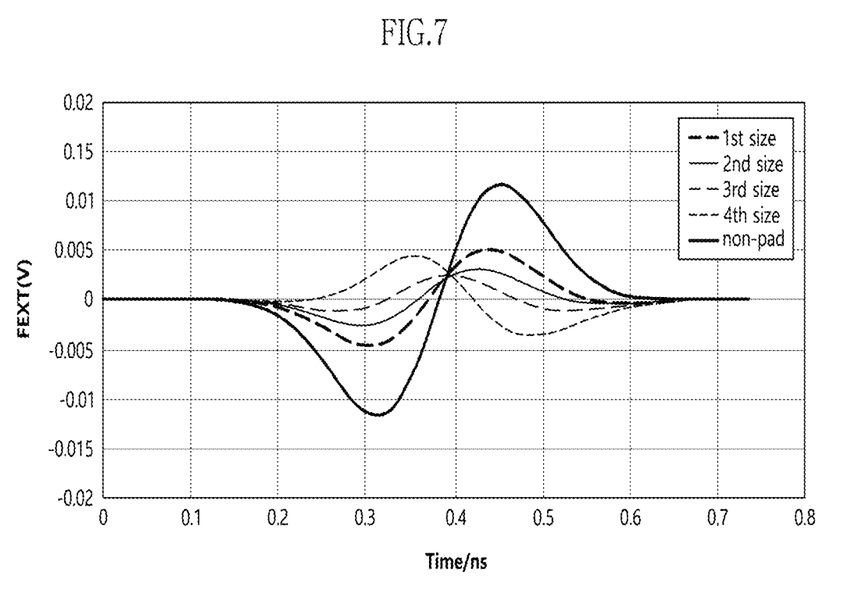
FIG. 7 illustrates measurement results of far end crosstalk (FEXT) when a size of an auxiliary pattern varies in accordance with example embodiments.

FIG. 7 is a graph showing measurement results of FEXT with inserting a pair of auxiliary patterns in accordance with embodiments.

FIG. 7 shows the measurement results of the FEXT in volts under different conditions that an auxiliary pattern is not provided, and that each of first and second auxiliary patterns (e.g., the first and second auxiliary patterns 125a and 125b in FIG. 2) may have first to fourth sizes. When each of the first and second auxiliary patterns 125a and 125b has either one of the first and second sizes, each of the first and second auxiliary patterns 125a and 125b may be disposed within the area of a corresponding one of the upper conductive terminals 130a and 130c. When each of the first and second auxiliary patterns 125a and 125b has either one of the third and fourth sizes, one or more portions of each of the first and second auxiliary patterns 125a and 125b may be disposed outside the area of a corresponding one of the upper conductive terminals 130a and 130c.

As shown in FIG. 7, when the first and second auxiliary patterns 125a and 125b are provided in a PCB (e.g, the PCB 110 in FIG. 2) to overlap with the upper conductive terminals 130a and 130c, respectively, the FEXT amplitude may be reduced compared to when the auxiliary patterns 125a and 125b are not provided in the PCB 110.

The first size is smaller than the second size. When the size of each of the first and second auxiliary patterns 125a and 125b increases from the first size to the second size within the area of each of the upper conductive terminals 130a and 130c, each of the first and second mutual capacitances Cma and Cmb may be increased, thereby reducing the FEXT amplitude. In an embodiment, a surface area of the first or second auxiliary patterns 125a or 125b is at least 20% of a surface area of the upper conductive terminal 130a or 130c. In an embodiment, when each of the first and second auxiliary patterns 125a and 125b has the second size, a width of the auxiliary pattern 125a or 125b in a first direction (e.g., the direction along the line III-III' in FIG. 2) is in a range from 70% to about 90% or from about 80% to about 90% of that of the upper conductive terminal 130a or 130c. For example, when the width of the auxiliary pattern 125a or 125b in the first direction is about 80%, the width is in a range from 79% to 81%, from 79.5% to 80.5%, from 79.7% to 80.3%, or from 79.9% to 80.1%.

In contrast, the size of each of the first and second auxiliary patterns 125a and 125b may be greater than the area of each of the upper conductive terminals 130a and 130c. For example, when each of the first and second auxiliary patterns 125a and 125b has either one of the third and fourth sizes, the fourth size being greater than the third size, FIG. 7 shows the FEXT may be over-compensated. Specifically, when each of the first and second auxiliary patterns 125a and 125b has the third size, the effective mutual capacitance Ce including the first and second mutual capacitances Cma and Cmb may become excessively large to make the first ratio Cm/C greater than the second ratio Lm/L in Formula 1. As a result, FIG. 7 shows that the FEXT when each of the first and second auxiliary patterns 125a and 125b has the third size starts to have an opposite sign to the FEXT when no auxiliary pattern is provided. In an embodiment, each of the upper conductive terminals 130a and 130c overlaps with at least 90% of a surface area of each of the first and second conductive auxiliary patterns 125a and 125b, to substantially suppress the over-compensation of the FEXT.

Figure 8:
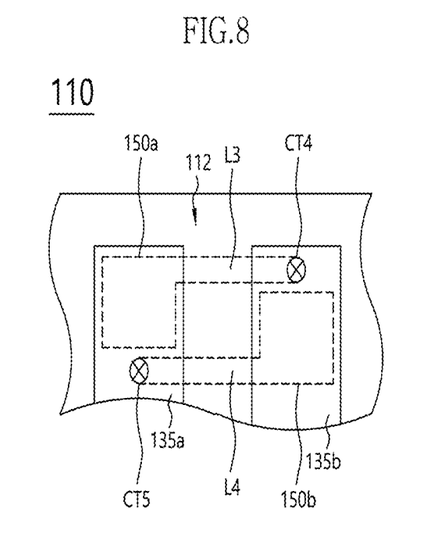
FIG. 8 is a bottom view illustrating a DIMM in accordance with an embodiment.

FIG. 8 is a bottom view illustrating a DIMM (e.g., the DIMM 100 in FIG. 1) in accordance with an embodiment.

Referring to FIG. 8, a first lower conductive terminal 135a and a second lower conductive terminal 135b may be arranged on an edge portion of the rear surface 112 of the PCB 110. A first lower auxiliary pattern 150a and a second lower auxiliary pattern 150b may be further formed in the PCB 110. The first and second lower auxiliary patterns 150a and 150b may face the first and second lower conductive terminals 135a and 135b, respectively. An insulating layer (e.g., the lower insulating layer 121a in FIGS. 3 and 4) may be interposed between the first and second lower auxiliary patterns 150a and 150b and the first and second lower conductive terminals 135a and 135b.

The first and second lower auxiliary patterns 150 and 150b may be located between the lower insulating layer 121a and the stack structure S, for example, a lowermost build-up layer. The first lower auxiliary pattern 150a may at least partially overlap with the first lower conductive terminal 135a. The first lower auxiliary pattern 150a may be electrically connected with the second lower conductive terminal 135b through a connection L3 and a contact CT4. The second lower auxiliary pattern 150b may at least partially overlap with the second lower conductive terminal 135b. The second lower auxiliary pattern 150b may be electrically connected with the first lower conductive terminal 135a through a connection L4 and a contact CT5.

Thus, the auxiliary patterns 150a and 150b may be formed in the PCB 110 to adjust the mutual capacitance between the adjacent lower conductive terminals 135a and 135b for transmitting the I/O signals.

Figure 9:
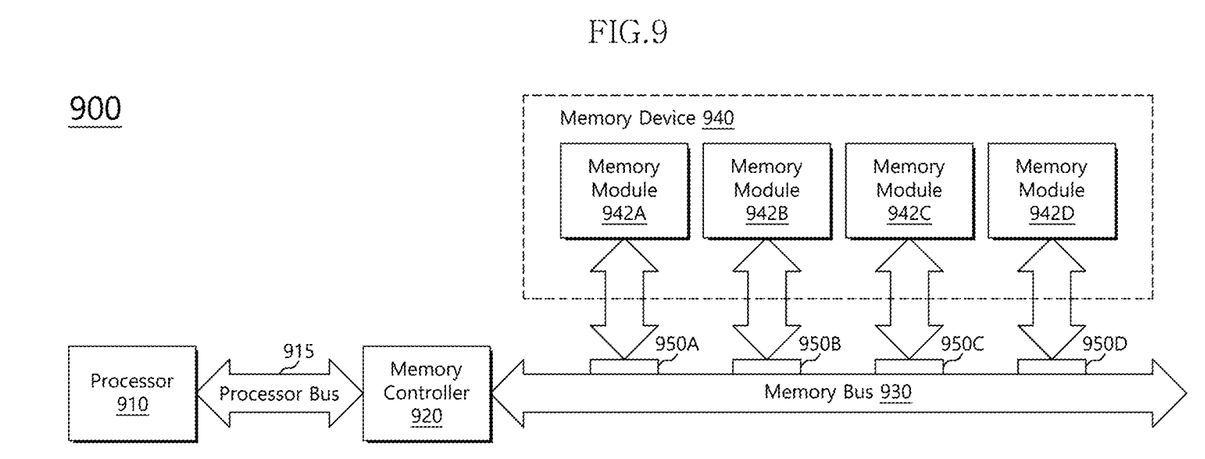
FIG. 9 illustrates a computer system including a plurality of memory modules according to an embodiment.

FIG. 9 illustrates a computer system 900 (or electronic device) including a plurality of memory modules 942A to 942D according to an embodiment. The computer system 900 includes a processor 910, a memory controller 920, and a memory device 940.

The processor 910 is coupled to the memory controller 920 by a processor bus 915. In an embodiment, the memory controller 920 is configured for controlling an operation of the memory device 940 in response to a request from the processor 910. In another embodiment, the memory controller 920 is configured for controlling an operation of the memory device 940 in response to a request from a host (not shown). The memory controller 920 is coupled to the memory device 940 by a memory bus 930.

The memory device 940 includes a plurality of memory modules 942A to 942D. The plurality of memory modules 942A to 942D are connected to the memory bus 930 through a plurality of connectors 950A to 950D, respectively. In an embodiment, each of the plurality of memory modules 942A to 942D is suitable for use as the DIMM 100 in FIG. 1, and each of the plurality of connectors 950A to 950D is suitable for use as the DIMM connector 150.

When one (e.g., the first memory module 942A) of the memory modules 942A to 944D is inserted into a corresponding one (e.g., the first connector 950A) of the connectors 950A to 950D, the inserted memory module may function as a main memory of the computer system 900. Additional memory modules (e.g., the second, third, and fourth memory modules 942B, 942C, and 942D) may be inserted into unoccupied connectors (et., the second, third, and fourth connectors 950B, 950C, and 950D) to expand the storage capacity of the main memory.

According to example embodiments, each of a plurality of auxiliary patterns in a PCB may face a corresponding one of upper and lower conductive terminals for transmitting the I/O signals. Thus, a mutual capacitance formed by a pair of each of the auxiliary patterns and each of the conductive terminals may adjust the effective mutual capacitance between adjacent conductive terminals that transmit the I/O signals to reduce the crosstalk between the adjacent conductive terminals.

Further, a first auxiliary pattern faces a first I/O signal terminal receiving a first I/O signal and the first auxiliary pattern may be electrically connected to a second I/O signal terminal that faces a second auxiliary pattern. Thus, the first auxiliary pattern receives the second I/O signal received by the second I/O signal terminal. As a result, the mutual capacitor may be continuously formed between the first auxiliary pattern and the first I/O signal terminal (or a first I/O signal pad). Therefore, when a level of the first or second I/O signal may be changed, desirable FEXT characteristics (e.g., reduced FEXT amplitude) may be ensured.

The above described embodiments of the present disclosure are intended to illustrate and not to limit the invention of the present disclosure. Various alternatives and equivalents are possible. The invention is not limited by the embodiments described herein. Nor is the invention limited to any specific type of semiconductor device. Other additions, subtractions, or modifications are possible in view of the present disclosure and are intended to fall within the scope of the appended claims.

What is claimed is:

1. A device, comprising:
    a substrate having a first surface and a second surface;
    a first conductive terminal disposed over the first surface and receiving a first signal;
    a second conductive terminal spaced apart from the first conductive terminal in a first direction and disposed over the first surface and receiving a second signal different from the first signal;
    a first conductive auxiliary pattern disposed below the first conductive terminal and overlapping with the first conductive terminal, the first conductive auxiliary pattern being coupled to the second conductive terminal;
    a second conductive auxiliary pattern disposed below the second conductive terminal and overlapping with the second conducive terminal, the second conductive auxiliary pattern being coupled to the first conductive terminal;
    a first capacitor generated between the first conductive terminal and the first conductive auxiliary pattern; and
    a second capacitor generated between the second conductive terminal and the second conductive auxiliary pattern.

2. The device of claim 1, further comprising an insulating layer disposed between the first conductive auxiliary pattern and the first conductive terminal and between the second conductive auxiliary pattern and the second conductive terminal.

3. The device of claim 1, wherein the substrate is a printed circuit board (PCB), and the device is a semiconductor module having a plurality of semiconductor chips provided on the PCB.

4. The device of claim 3, further comprising:
    a first contact disposed below the first surface and coupled to the second conductive terminal, the first contact extending along a second direction substantially orthogonal to the first direction; and
    a first connection disposed below the first surface and coupling the first contact and the first conductive auxiliary pattern.

5. The device of claim 1, further comprising:
    a third conductive terminal disposed over the second surface, the second surface being on an opposite side of the first surface; and
    a third conductive auxiliary pattern disposed below the third conductive terminal and overlapping with the third conductive terminal;
    a fourth conductive terminal disposed over the second surface and spaced apart from the third conductive terminal in the first direction; and
    a fourth conductive auxiliary pattern disposed below the fourth conductive terminal and overlapping with the fourth conductive terminal,
    wherein the third conductive auxiliary pattern is coupled to the fourth conducive terminal, and the fourth conductive auxiliary pattern is coupled to the third conductive terminal.

6. The device of claim 5, further comprising an insulating layer disposed between the third conductive auxiliary pattern and the third conductive terminal and between the fourth conductive auxiliary pattern and the fourth conductive terminal.

7. The device of claim 1, wherein the first conductive auxiliary pattern is disposed entirely within a surface area defined by the first conductive terminal, so that the first conductive auxiliary pattern overlaps entirely with the first conductive terminal when seen in a second direction substantially orthogonal to the surface area defined by the first conductive terminal.

8. The device of claim 1, further comprising:
a third capacitor generated between the first conductive terminal and the second conductive terminal,
wherein the first to third capacitors are generated by a voltage difference between the first signal and the second signal.

9. A semiconductor module, comprising:
a printed circuit board (PCB) having a first surface and a second surface;
a plurality of semiconductor chips disposed over the first surface of the PCB;
first and second conductive terminals configured to communicate with the plurality of semiconductor chips, the first and second conductive terminals being disposed over the first surface of the PCB and spaced apart from each other in a first direction;
first and second conductive auxiliary patterns disposed in the PCB, the first and second conductive auxiliary patterns provided below the first and second conductive terminals and overlapping with the first and second conductive terminals, respectively;
a first capacitor generated between the first conductive terminal and the first conductive auxiliary pattern; and
a second capacitor generated between the second conductive terminal and the second conductive auxiliary pattern,
wherein the first conductive auxiliary pattern is coupled to the second conductive terminal, and the second conductive auxiliary pattern is coupled to the first conductive terminal, and
wherein the first conductive terminal receives a first signal and the second conductive terminal receives a second signal having a different voltage level from that of the first signal.

10. The module of claim 9, further comprising an insulating layer disposed between the first and second conductive auxiliary patterns and the first and second conductive terminals.

11. The module of claim 9, further comprising:
third and fourth conductive terminals disposed over the second surface of the PCB; and
third and fourth conductive auxiliary patterns disposed in the PCB, the third and fourth conductive auxiliary patterns provided below and overlapping the third and fourth conductive terminals, respectively,
wherein the third conductive auxiliary pattern is coupled to the fourth conductive terminal, and the fourth conductive auxiliary pattern is coupled to the third conductive terminal.

12. The module of claim 11, further comprising an insulating layer disposed between the third and fourth conductive auxiliary patterns and the third and fourth conductive terminals.

13. The module of claim 11, further comprising:
a through silicon via (TSV) to connect the first conductive terminal to the third conductive terminal.

14. The module of claim 9, wherein the first conductive auxiliary pattern is disposed entirely within a surface area defined by the first conductive terminal, so that the first conductive auxiliary pattern overlaps entirely with the first conductive terminal when seen in a second direction substantially orthogonal to the surface area defined by the first conductive terminal.

15. The semiconductor module of claim 9, further comprising:
a third capacitor generated between the first conductive terminal and the second conductive terminal,
wherein the first to third capacitors are generated by a voltage difference between the first signal and the second signal.

16. An electronic device, comprising:
a memory module configured to store data; and
a controller configured to control an operation of the memory module; and
a processor configured to process data received from the controller,
wherein the memory module includes:
a printed circuit board (PCB) having a first surface and a second surface;
a plurality of semiconductor chips disposed over the first surface of the PCB;
first and second conductive terminals configured to communicate with the plurality of semiconductor chips, the first and second conductive terminals being disposed over the first surface of the PCB;
first and second conductive auxiliary patterns disposed in the PCB, the first and second conductive auxiliary patterns provided below the first and second conductive terminals and overlapping with the first and second conductive terminals, respectively;
a first capacitor generated between the first conductive terminal and the first conductive auxiliary pattern; and
a second capacitor generated between the second conductive terminal and the second conductive auxiliary pattern, and
wherein the first conductive auxiliary pattern is coupled to the second conductive terminal, and the second conductive auxiliary pattern is coupled to the first conductive terminal, and
wherein the first conductive terminal receives a first signal and the second conductive terminal receives a second signal having a different voltage level from that of the first signal.

17. The electronic device of claim 16, further comprising an insulating layer disposed between the first conductive auxiliary pattern and the first conductive terminal and between the second conductive auxiliary pattern and the second conductive terminal.

18. The electronic device of claim 16, further comprising:
a third capacitor generated between the first conductive terminal and the second conductive terminal,
wherein the first to third capacitors are generated by a voltage difference between the first signal and the second signal.

* * * * *